United States Patent [19]

McLaury

[11] Patent Number: 5,553,028
[45] Date of Patent: Sep. 3, 1996

[54] SINGLE P-SENSE AMP CIRCUIT USING DEPLETION ISOLATION DEVICES

[75] Inventor: Loren L. McLaury, Boise, Id.

[73] Assignee: Micron Technology, Inc., Boise, Id.

[21] Appl. No.: 494,239

[22] Filed: Jun. 23, 1995

[51] Int. Cl.⁶ .................................................. G11C 7/00
[52] U.S. Cl. ................................... 365/205; 365/207
[58] Field of Search ................................. 365/205, 207, 365/202

[56] References Cited

U.S. PATENT DOCUMENTS

| | | | |
|---|---|---|---|
| 5,245,578 | 9/1993 | McLaury | 365/203 |
| 5,265,050 | 11/1993 | McLaury | 365/189.01 |
| 5,294,585 | 12/1993 | Suyama et al. | 365/205 X |
| 5,311,478 | 5/1994 | Zagar et al. | 365/230.06 |
| 5,313,431 | 5/1994 | Uruma et al. | 365/205 X |
| 5,323,350 | 6/1994 | McLaury | 365/208 |
| 5,369,622 | 11/1994 | McLaury | 365/233 |

*Primary Examiner*—Do Hyun Yoo
*Attorney, Agent, or Firm*—Schwegman, Lundberg, Woessner & Kluth, P.A.

[57] ABSTRACT

An integrated circuit dynamic memory is described which shares a p-sense amplifier between two memory arrays. More specifically, a dynamic random access memory (DRAM) is disclosed which uses n-channel depletion transistors to couple the shared p-sense amplifier to two memory arrays. The depletion transistors use a gate voltage equal to the power supply potential to perform a complete write-back operation on one memory array and use a negative potential to isolate the p-sense amp from the other memory array.

9 Claims, 3 Drawing Sheets

5,553,028

SINGLE P-SENSE AMP CIRCUIT USING DEPLETION ISOLATION DEVICES

TECHNICAL FIELD OF THE INVENTION

The present invention relates generally to integrated circuits and in particular the present invention relates to sensing amplifiers used in integrated circuit memories.

BACKGROUND OF THE INVENTION

Dynamic integrated circuit memories such as a dynamic random access memory (DRAM) traditionally stores data as a charge on a memory cell capacitor. For example, a logical "one" is stored as a potential on the capacitor and a logical "zero" is represented by an uncharged capacitor. Because of the dense population of memory cells in an integrated circuit, the capacitance of each memory cell is small and the available charge is proportionally small. To read data from the memory cells, therefore, the charge must be sensed and amplified.

Typical memory circuits are designed to have pairs of data lines selectively coupled to the memory cells. The data line pairs are pre-charged to an equal potential between ground and the supply potential. When a memory cell is coupled to one of the data lines, a differential voltage is established between the data line pairs. A n-channel sense amplifier is used to detect the differential voltage and pull the low data line to ground. Likewise, a p-channel sense amplifier is used to detect the differential and drive the high data line to the supply voltage. As stated, the DRAM memory cell is dynamic, and as such the data must be periodically refreshed by writing back the data to the memory cell. To extend the period between write back, the initial charge stored on the memory cell should be provided using the maximum available potential voltage. Further, sense amplifiers are often shared between many memory cells to reduce the number of amplifiers needed for a memory circuit. Problem arise, however, in sharing the p-sense amplifiers. To maintain a maximum charging potential during the memory cell refresh, the p-sense amplifier must be coupled directly to the memory cell, or by using a transistor having a pumped gate voltage which is a threshold level above the supply voltage. Additional circuitry and current must, therefore, be provided to source the pumped gate voltage.

For the reasons stated above, and for other reasons stated below which will become apparent to those skilled in the art upon reading and understanding the present specification, there is a need in the art for a memory circuit capable of complete write back operations using shared sense amplifiers without requiring a pumped voltage.

SUMMARY OF THE INVENTION

The above mentioned problems with integrated memory circuits and other problems are addressed by the present invention and which will be understood by reading and studying the following specification. An integrated memory circuit is described which has n-channel depletion transistors used to selectively couple shared sense amplifiers to memory arrays.

In particular, the present invention describes an integrated circuit memory comprising memory arrays and digit lines coupled to the memory arrays. A plurality of n-channel depletion transistors are connected to the digit lines, and shared sense amplifiers are electrically connected to the n-channel depletion transistors for selectively coupling to one of the memory arrays. One embodiment includes a driver circuit connected to a gate of the n-channel depletion transistors. The driver circuit drives a first potential to an active n-channel depletion transistor, while the remaining n-channel depletion transistors are inactive. The driver circuit also drives a gate of the inactive n-channel depletion transistors to a second voltage. The first potential has a value equal to the supply voltage, and the second potential has a value less than a ground reference.

The shared sense amplifiers can comprise an n-sense amplifier, and a p-sense amplifier. Further, the memory arrays can each comprise memory cells, and access transistors connected to the memory cells for selectively coupling a memory cell to one of the digit lines.

The n-channel depletion transistors, in one embodiment, have a source connected to one of the digit lines, a drain connected to the shared sense amplifiers, and a gate connected to a select line for selectively connecting one of the digit lines to the shared sense amplifiers.

In another embodiment, a dynamic random access memory comprises a plurality of memory arrays each having a plurality of dynamic memory cells and a plurality of access devices connected to the plurality of dynamic memory cells, and a plurality of pairs of digit lines, each pair connected to one of the plurality of memory arrays. The memory further comprises a shared p-sense amplifier, a shared n-sense amplifier, and a plurality of n-channel depletion transistors selectively coupling the plurality of pairs of digit lines to the shared p-sense amplifier and the n-sense amplifier.

Another embodiment describes a method of sensing data stored on a dynamic memory cell in a first memory of an integrated memory circuit having sense amplifiers shared between the first memory array and a second memory array. The method comprises the steps of selectively isolating the sense amplifiers from the second memory array using a negative potential, selectively connecting the sense amplifiers to the first memory array using a positive potential, and then using the sense amplifiers to sense a charge stored on the dynamic memory cell.

DETAILED DESCRIPTION OF THE INVENTION

In the following detailed description of the preferred embodiment, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
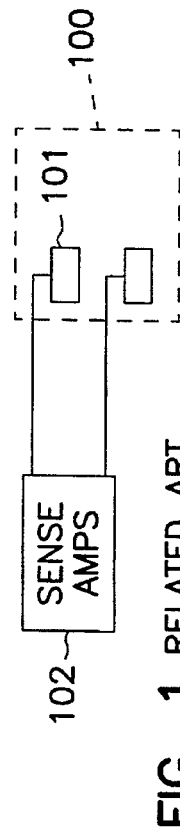
FIG. 1 is a simplified block diagram of sense amplifiers in a related memory circuit.

In the most general sense, a memory circuit comprises memory cells which store data. Depending upon the type of memory, this data can be read, or read and written. That is, some memories are read-only while others allow data to be read, manipulated, and re-written. Because many types of memories store data as a charge on a capacitor, sense amplifiers are implemented to detect small charges and amplify the charge for further processing. FIG. 1 is a simplified block diagram of a memory array 100 having memory cells 101 connected to a sense amplifier 102. The sense amplifier can be used to sense a charge stored on the memory cells and write the charge back to the memory cells.

Figure 2:
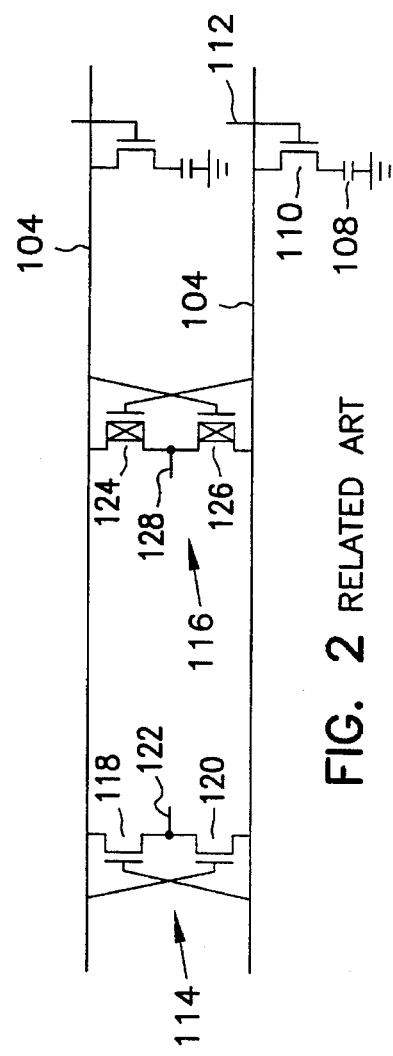
FIG. 2 is a schematic of the block diagram of FIG. 1.

Dynamic random access memories (DRAM) typically use memory cells fabricated as capacitors. These cells can be selectively connected to digit lines 104 which are connected to sense amplifiers, as shown in FIG. 2. The memory cells 108 are each connected to the source of an n-channel access transistor 110. The drain of the transistor is connected to a digit line 104. The gate of the transistor is connected to a word line 112 which is used to selectively connect one of the memory cells to the digit lines. The sense amplifier is comprised of two amplifiers; an n-sense amp 114 and a p-sense amp 116. The n-sense amp has two cross coupled n-channel transistors 118 and 120. The source of each transistor is connected to a N-strobe line 122, which normally has a bias level of one-half the supply voltage (Vcc) and is strobed low as detailed below. The p-sense amp 116 has two cross coupled p-channel transistors 124 and 126. The source of each transistor is connected to a P-strobe line 128, which normally biased to one-half the supply voltage but is strobed high as detailed below.

To access and sense data in a memory cell 108, the digit lines 104 are precharged to Vcc/2 and then the access transistor 110 connected to the memory cell is selectively activated by providing a high voltage on its associated word line 112. The memory cell is then electrically connected to the digit line 104 through the access transistor. Any charge stored on the memory cell capacitor is shared with the digit line. The potential of the digit line will typically only change by a fraction of a volt, approximately 200 mv. The N-strobe line 122 is strobed low to connect one of the digit lines 104 to a low voltage. As the N-strobe line goes low, the first transistor 118 or 120, which has a gate voltage a threshold voltage (Vt) above the N-strobe voltage will be activated and its source will be electrically connected to the N-strobe line. The second transistor 118 or 120, cannot be activated because its gate will not exceed the n-strobe voltage by a threshold voltage. If the selected memory cell 108 has data stored as a voltage, the complementary digit line connected to the sense amplifiers will be forced low by the n-sense amp 116. Similarly, if the selected memory cell has data stored as a discharged capacitor the coupled digit line is forced low by the n-sense amp.

After the n-sense amp 114 has been strobed, the p-sense amp 116 is strobed by raising the voltage on the P-strobe line 128. The transistor, 124 or 126 whose gate voltage is a threshold voltage below the p-strobe source voltage will be activated. The digit line, therefore, which was pulled low by the n-sense amp will activate one of the transistors, 124 or 126, and force the other digit line to the p-strobe line level. If the selected memory cell has data stored as a voltage, the coupled digit line will be forced high by the p-sense amp. Thus, by using both sense amplifiers the digit line associated with the memory cell has been forced to a power rail representing the data stored on the memory cell.

By activating the access device the memory cell can be written back to the memory cell. This "write back" operation is important to the operation of the dynamic memory. By using capacitors as memory cells, the data is dynamic and will be lost if the memory cell is not periodically refreshed. By writing the data back to the memory cell, the data is refreshed and can be maintained for a longer period. It will be understood that the maximum available voltage should be used to write to a memory cell to extend the period in which a refresh is needed. That is, to write a logical one to a memory cell the full supply voltage (Vcc) should be connected to the memory cell.

To insure that the digit line connected to a memory cell is at a maximum level, the p-sense amp 116 is connected directly to the digit lines 104. If an isolation transistor were placed between the digit line and the p-sense amplifier, the memory cell would lose some initial voltage. That is, isolation transistors, as known to one skilled in the art, are typically n-channel enhancement devices and can only transmit Vgate-Vt of voltage from drain to source. Thus when the maximum Vgate=Vcc there is a Vt drop from one side of the isolation transistor to the other. Therefore, in order to provide the maximum potential on the digit line (assumed to be Vcc), the active pull up circuit (or p-sense amp) must be directly coupled to the digit line. Further, the word lines 112 connected to the access transistors are typically driven to a voltage level (Vccp) which is above the voltage supply level (Vcc). This allows the full digit line voltage to be connected to the memory cell without losing a threshold drop.

Figure 3:
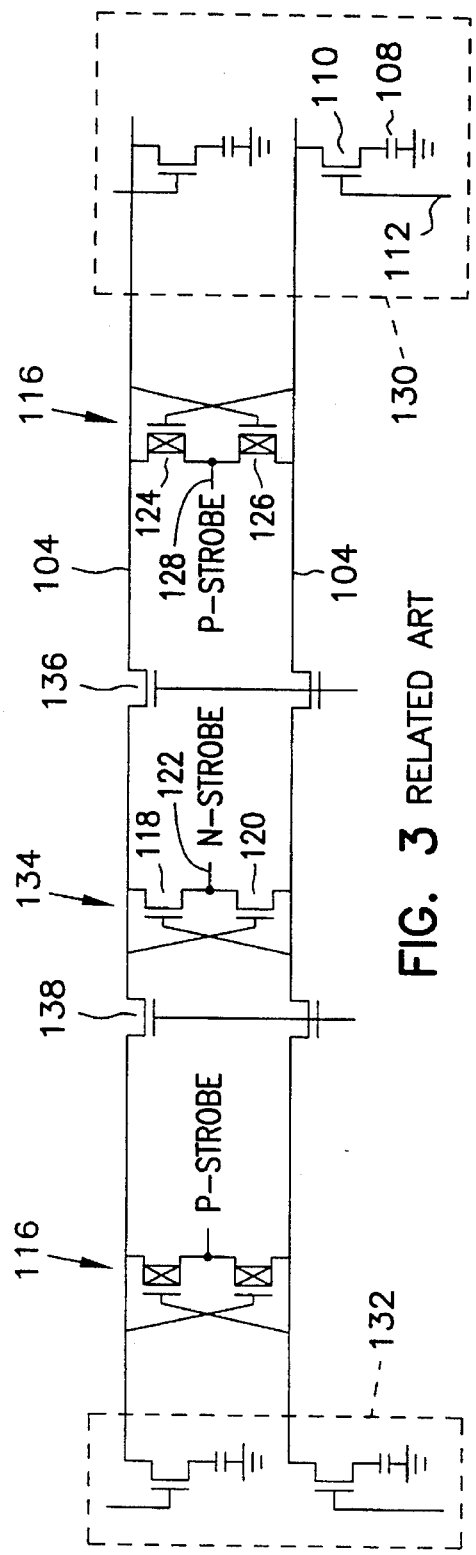
FIG. 3 is a schematic of an n-sense amplifier and a p-sense amplifier in a related memory circuit.

To reduce the number of sense amplifiers used in a memory circuit, the n-sense amplifiers can be shared between two memory arrays. As seen in FIG. 3, two sets of memory cell arrays 130 and 132 can be connected to a common n-sense amp 134 by using isolation transistors 136 and 138. By placing isolation transistors 136 and 138 between one n-sense amp 134 and the memory arrays 130 and 132, the two memory arrays can share the n-sense amplifier. Activating either the gates of transistors 136 or 138 will connect the n-sense amp to either memory array 130 or 132, respectively. The p-sense amps cannot be shared in this manner, however, without losing a Vt.

Figure 4:
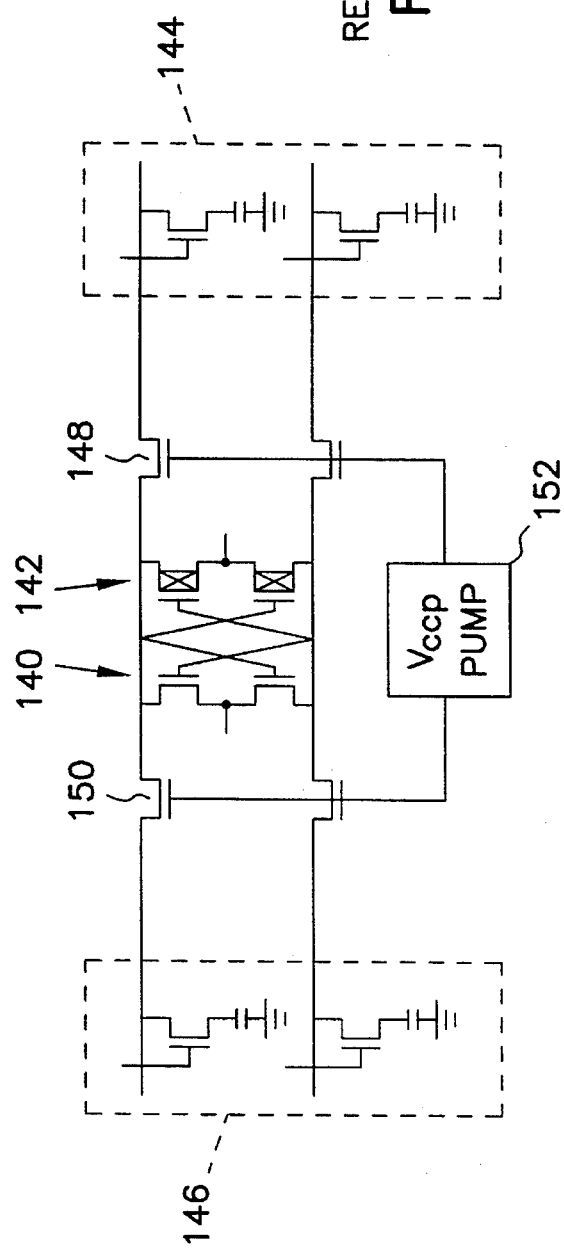
FIG. 4 is a schematic of shared sense amplifiers using pumped voltages in a related memory circuit.

FIG. 4 illustrates a memory circuit which shares both n-sense 140 and p-sense 142 amps with two memory cell arrays 144 and 146. Isolation transistors 148 and 150 are located between the sense amps and the memory arrays. The gates of the isolation transistors 148 and 150 are, however, connected to a pumped voltage (Vccp), provided by the Vccp pump 152, so that the digit line does not lose a threshold voltage. This technique requires that the voltage pump supply 152 be large enough to drive both the word lines 112, as described above, and the isolation transistors 148 and 150. Further, it will be understood that the current demands associated with driving the isolation transistors to Vccp is undesirable.

Figure 5:
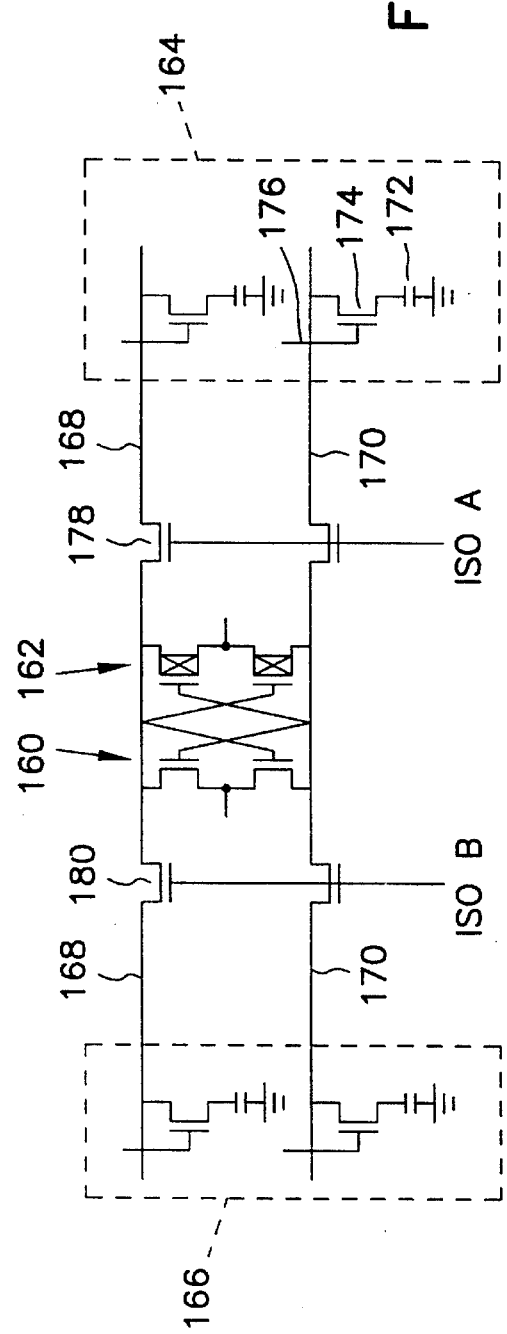
FIG. 5 is a schematic of a sense circuit of a memory circuit of the present invention.

The present invention allows one n-sense amp 160 and one p-sense amp 162 to be shared with two memory cell arrays 164 and 166 without placing extra die area and current demands on the integrated memory circuit. FIG. 5 shows one embodiment of the present invention. The two memory arrays 164 and 166 each are connected to a pair of digit lines 168 and 170. The memory arrays comprise memory cell capacitors 172 connected to an access transistor 174. The gate of the access transistor 174 is connected to a word line 176 which is used to connect a memory cell to one of the digit lines 168 or 170 of the digit line pair. The n-sense amp and p-sense amp are selectively connected to one memory array by isolation transistors 178 and 180. The isolation transistors are depletion, n-channel transistors. By using isolation transistors which are depletion, n-channel transistors, a new architecture employing only one shared p-sense amp can provide full voltage range to the digit lines and save silicon space (or "real estate").

The isolation transistors are controlled by their gate potential. FIG. 5 shows the isolation transistors 178 having a gate connected to an ISO A Line and transistors 180 connected to an ISO B Line. The gate potential is held at Vcc to couple the complete dynamic range of voltages provided by the p-sense amp and the n-sense amp to the digit line pair with the selected memory cell 172. The gate potential on either ISO A or ISO B is lowered to a predetermined negative voltage (with respect to the lowest voltage seen on the digit lines during operation) to isolate the unselected memory array from the sense amps. By operating the depletion isolation devices in the above fashion it is possible to realize a new single p-sense-amp architecture which provides full voltage swing on the digit lines for write back (refresh), while saving significant die area in the sense amp region. As well, if the negative potential is equivalent to Vbb, the substrate potential, then no new capacitor needs to be provided to supply the potential.

Figure 6:
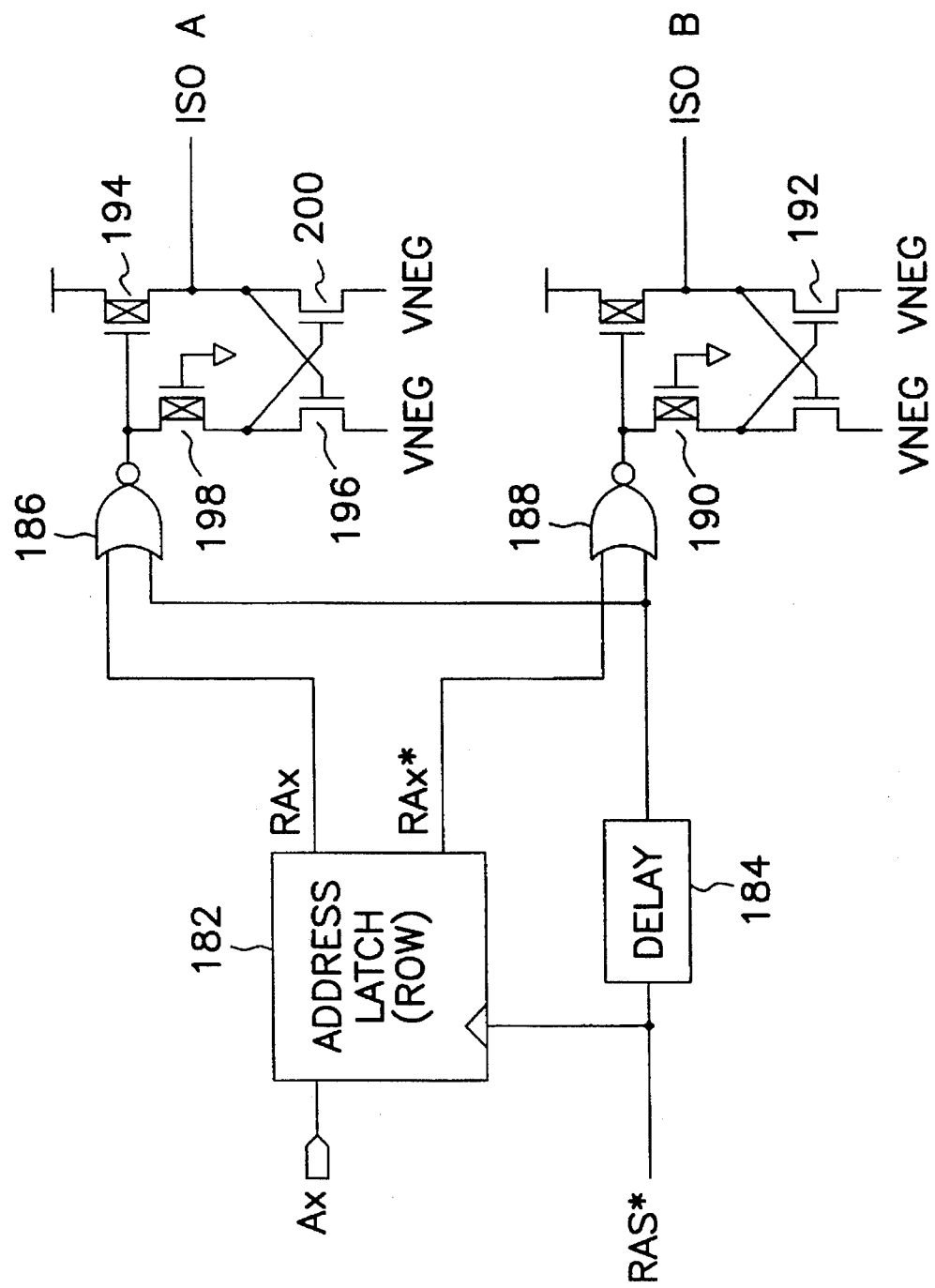
FIG. 6 is a control circuit for controlling isolation transistors of FIG. 5.

FIG. 6 shows a driver circuit for supplying the depletion isolation transistor negative gate potentials ISO A and ISO B. Different circuits can be used to control ISO A and ISO B, for example U.S. Pat. No. 5,410,508 entitled "Pumped Wordlines" and assigned to the assignee of the present invention describes a circuit and method for maintaining a negative potential, and is incorporated herein by reference. An address input (Ax) provides an address of a memory cell row in one of the memory arrays that is to be accessed, and thus which array section is to be isolated. The word lines 176, as known to one skilled in the art, are coupled to row lines which can be addressed to access a row of memory cells. The address is preferably a more significant row address but any row address could be used.

The address (Ax) is latched in the address latch 182 which provides the row address (RAx) and the row address complement (RAx*) which outputs lines when a row access strobe (RAS*) input goes low, as known to one skilled in the art. The RAx line goes high and the RAx* line goes low. The RAS* input is delayed by delay circuit 184 and the output of the delay circuit is connected to NOR gates 186 and 188. When both the RAx* and the RAS* line are low, the output of NOR gate 188 is high. Transistor 190 is thereby activated and connects the NOR 188 output to transistor 192 which pulls the ISO B line to a negative potential (Vneg) to isolate the sense amps from memory array 166.

When RAx is high, the output of NOR gate 186 is low and transistor 194 is activated. Both the ISO A line and the gate of transistor 196 are pulled high to Vcc. By activating transistor 196, transistors 198 and 200 are turned off. The circuit shown in FIG. 6, therefore, activates the depletion isolation transistors 178 or 180 associated with an addressed memory array, 164 or 166, respectively, and turns off the depletion isolation transistors to the non-addressed memory array.

Conclusion

A dynamic memory circuit has been described which shares one n-sense amplifier circuit and one p-sense amplifier circuit between more than one memory array. The sense amplifiers are selectively coupled to the memory arrays using n-type depletion transistors. The depletion transistors allow a complete write back of the memory cell by the p-sense amplifier without requiring a pumped voltage.

What is claimed is:

1. An integrated circuit memory comprising:

a plurality of memory arrays;

a plurality of digit lines each coupled to one of the plurality of memory arrays;

a plurality of n-channel depletion transistors each connected to one of the plurality of digit lines; and shared sense amplifiers electrically connected to the plurality of n-channel depletion transistors for selectively coupling to one of the plurality of memory arrays.

2. The integrated circuit memory of claim 1 further comprising:

a driver circuit connected to gates of the plurality of n-channel depletion transistors, the driver circuit driving a first potential to an active n-channel depletion transistor, remaining n-channel depletion transistors being inactive n-channel depletion transistors, the driver circuit driving gates of the inactive n-channel depletion transistors to a second potential, the first potential having a value equal to a supply voltage, and the second potential having a value less than a ground reference.

3. The integrated circuit memory of claim 1, wherein the shared sense amplifiers comprise an n-sense amplifier, and a p-sense amplifier.

4. The integrated circuit memory of claim 1, wherein the plurality of memory arrays each comprise:

a plurality of memory cells; and a plurality of access transistors each connected to one of the plurality of memory cells for selectively coupling the one of the plurality of memory cells to one of the plurality of digit lines.

5. The integrated circuit memory of claim 1 wherein each one of the plurality of n-channel depletion transistors has a source connected to one of the plurality of digit lines, a drain connected to the shared sense amplifiers, and a gate connected to a select line for selectively connecting the one of the plurality of digit lines to the shared sense amplifiers.

6. A dynamic random access memory comprising:

a plurality of memory arrays each having a plurality of dynamic memory cells and a plurality of access devices connected to the plurality of dynamic memory cells;

a plurality of pairs of digit lines, each pair connected to one of the plurality of memory arrays;

a shared p-sense amplifier;

a shared n-sense amplifier; and a plurality of n-channel depletion transistors selectively coupling the plurality of pairs of digit lines to the shared p-sense amplifier and the shared n-sense amplifier.

7. The dynamic random access memory of claim 6 wherein:

the shared n-sense amplifier comprises first and second n-channel transistors cross coupled to first and second nodes;

the shared p-sense amplifier comprises first and second p-channel transistors cross coupled to the first and second nodes; and the plurality of n-channel depletion transistors each has a drain connected to either the first or second node and a source connected to one digit line of the plurality of pairs of digit lines.

8. The dynamic random access memory of claim 6 further comprising:

a driver circuit connected to gates of the plurality of n-channel depletion transistors, the driver circuit driving a first potential to an active n-channel depletion transistor, remaining n-channel depletion transistors being inactive n-channel depletion transistors, the driver circuit driving gates of the inactive n-channel depletion transistors to a second potential, the first potential having a value equal to a supply voltage, and the second potential having a value less than a ground reference.

9. A method of sensing data stored on a dynamic memory cell in a first memory array of an integrated memory circuit having sense amplifiers shared between the first memory array and a second memory array, the method comprising the steps of:

selectively isolating the sense amplifiers from the second memory array by providing a negative potential to a gate of a first n-channel depletion transistor having a drain connected to the sense amplifiers and a source connected to the second memory array;

selectively connecting the sense amplifiers to the first memory array by providing a positive potential to a gate of a second n-channel depletion transistor having a drain connected to the sense amplifiers and a source connected to the first memory array; and using the sense amplifiers to sense a charge stored on the dynamic memory cell.

\* \* \* \* \*